United States Patent
Otsuka et al.

(10) Patent No.: US 9,856,361 B2
(45) Date of Patent: Jan. 2, 2018

(54) SURFACE-MODIFIED METAL OXIDE PARTICLE DISPERSION LIQUID, METHOD FOR PRODUCING SAME, SURFACE-MODIFIED METAL OXIDE PARTICLE-SILICONE RESIN COMPOSITE COMPOSITION, SURFACE-MODIFIED METAL OXIDE PARTICLE-SILICONE RESIN COMPOSITE BODY, OPTICAL MEMBER AND LIGHT EMITTING DEVICE

(71) Applicant: SUMITOMO OSAKA CEMENT CO., LTD., Tokyo (JP)

(72) Inventors: Takeshi Otsuka, Tokyo (JP); Kenji Harada, Tokyo (JP); Yasuyuki Kurino, Tokyo (JP); Takeru Yamaguchi, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 15/519,160

(22) PCT Filed: Oct. 16, 2015

(86) PCT No.: PCT/JP2015/079255
§ 371 (c)(1),
(2) Date: Apr. 14, 2017

(87) PCT Pub. No.: WO2016/060223
PCT Pub. Date: Apr. 21, 2016

(65) Prior Publication Data
US 2017/0226418 A1    Aug. 10, 2017

(30) Foreign Application Priority Data
Oct. 16, 2014    (JP) .................. 2014-211754

(51) Int. Cl.
*H01L 33/56* (2010.01)
*C08K 3/22* (2006.01)
(Continued)

(52) U.S. Cl.
CPC ............... *C08K 3/22* (2013.01); *C08G 77/12* (2013.01); *C08G 77/20* (2013.01); *C08G 77/80* (2013.01);
(Continued)

(58) Field of Classification Search
CPC .................... H01L 33/56; C08K 3/22
See application file for complete search history.

(56) References Cited

U.S. PATENT DOCUMENTS 9,422,315 B2 * 8/2016 Suenaga ............. A61K 8/585
2009/0140284 A1 * 6/2009 Kurino ............ C08G 83/001
257/100

(Continued)

FOREIGN PATENT DOCUMENTS

| JP | H10-251123 | 9/1998 |
| JP | 2002-060687 | 2/2002 |
| JP | 5162879 | 3/2013 |

OTHER PUBLICATIONS

"International Search Report (Form PCT/ISA/210) of PCT/JP2015/079255", dated on Jan. 12, 2016, with English translation thereof, pp. 1-4.

*Primary Examiner* — Evan Pert
(74) *Attorney, Agent, or Firm* — JCIPRNET

(57) ABSTRACT

Provided are a surface-modified metal oxide particle dispersion liquid and the like including surface-modified metal oxide particles that are dispersed in a dispersion medium, the surface-modified metal oxide particles being obtained by modifying surfaces of metal oxide particles to have hydrosilyl groups, hydrophobic functional groups, and silanol
(Continued)

groups. In the surface-modified metal oxide particle dispersion liquid, a ratio of the hydrosilyl groups to the silanol groups is 5:95 or higher and 50:50 or lower.

13 Claims, 1 Drawing Sheet

(51) Int. Cl.
- C08G 77/20 (2006.01)
- C08G 77/00 (2006.01)
- C08K 9/06 (2006.01)
- C08K 5/56 (2006.01)
- C08L 83/04 (2006.01)
- C09D 183/04 (2006.01)
- C08G 77/12 (2006.01)

(52) U.S. Cl.
CPC ............... *C08K 5/56* (2013.01); *C08K 9/06* (2013.01); *C08L 83/04* (2013.01); *C09D 183/04* (2013.01); *H01L 33/56* (2013.01)

(56) References Cited

U.S. PATENT DOCUMENTS

| | | | |
|---|---|---|---|
| 2009/0163654 A1* | 6/2009 | Hirano | C08G 77/18 524/783 |
| 2009/0189510 A1* | 7/2009 | Kanamori | C09D 143/04 313/498 |
| 2009/0191404 A1* | 7/2009 | Itai | C08F 222/1006 428/336 |
| 2010/0010138 A1* | 1/2010 | Kikuchi | G02B 1/04 524/430 |
| 2010/0036051 A1* | 2/2010 | Hirano | C08G 77/18 524/781 |
| 2010/0055454 A1* | 3/2010 | Tadakuma | C01G 23/00 428/338 |
| 2011/0098420 A1* | 4/2011 | Takizawa | C08L 83/04 525/477 |
| 2011/0260209 A1* | 10/2011 | Katayama | C08L 83/04 257/100 |
| 2013/0011606 A1* | 1/2013 | Otomo | C08L 83/04 428/131 |
| 2013/0032852 A1* | 2/2013 | Kimura | H01L 23/296 257/100 |
| 2013/0105997 A1* | 5/2013 | Matsuda | C09D 183/04 257/791 |
| 2015/0021643 A1* | 1/2015 | Kurino | C01G 23/0536 257/98 |
| 2015/0274894 A1* | 10/2015 | Sato | C08K 5/56 257/100 |

* cited by examiner

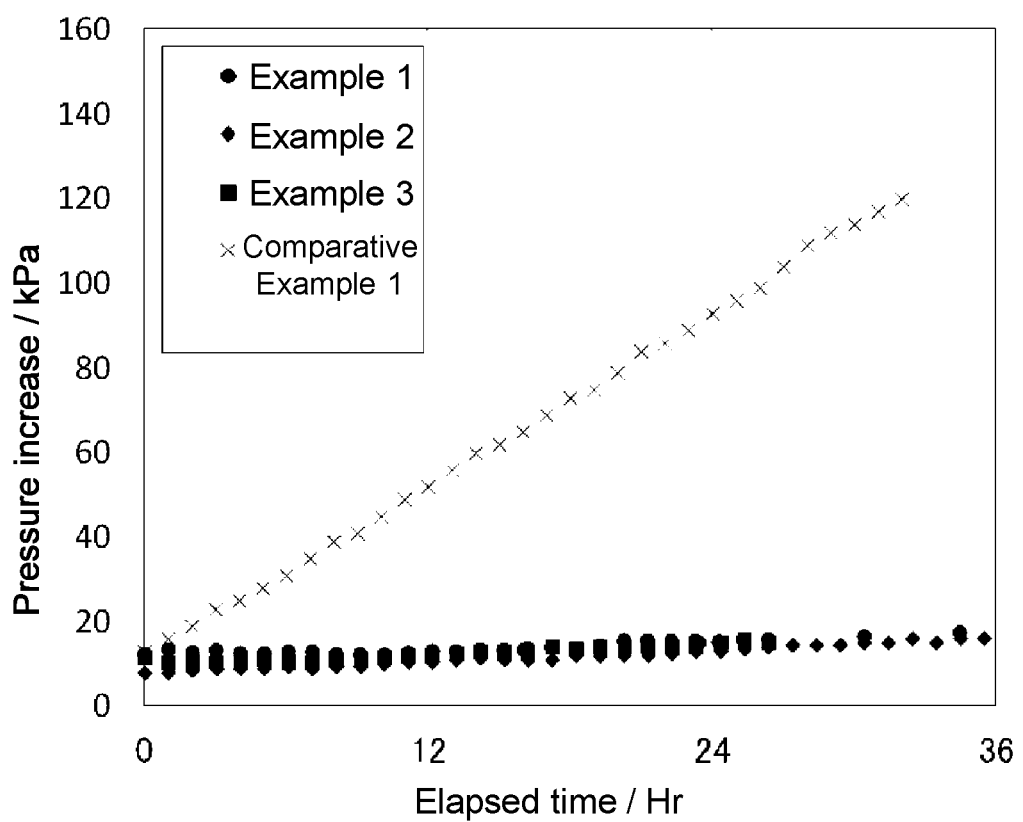

SURFACE-MODIFIED METAL OXIDE PARTICLE DISPERSION LIQUID, METHOD FOR PRODUCING SAME, SURFACE-MODIFIED METAL OXIDE PARTICLE-SILICONE RESIN COMPOSITE COMPOSITION, SURFACE-MODIFIED METAL OXIDE PARTICLE-SILICONE RESIN COMPOSITE BODY, OPTICAL MEMBER AND LIGHT EMITTING DEVICE

CROSS-REFERENCE TO RELATED APPLICATION

This application is a 371 application of the International PCT Application serial no. PCT/JP2015/079255, filed on Oct. 16, 2015, which claims the priority benefit of Japan Application no. 2014-211754, filed on Oct. 16, 2014. The entirety of each of the above-mentioned patent applications is hereby incorporated by reference herein and made a part of this specification.

TECHNICAL FIELD

This invention relates to a surface-modified metal oxide particle dispersion liquid, a method of producing the same, a surface-modified metal oxide particle-silicone resin composite composition, a surface-modified metal oxide particle-silicone resin composite body, an optical member, and a light emitting device.

BACKGROUND ART

A method of conjugating a polymer material and an inorganic material such as a metal oxide with each other to impart characteristics of the inorganic material to the polymer material is significantly useful for preparing a new functional material. In general, in a case where such a conjugation is attempted, for example, various methods such as modifying a surface of an inorganic material such as a metal oxide to improve compatibility between the inorganic material and a polymer material or obtaining a composite body through polymerization of raw materials conjugated in advance are used.

Among polymer materials, a silicone resin has not only excellent weather resistance such as heat resistance or cold resistance but also excellent electrical properties, low toxicity, and the like. Therefore, a silicone resin is used as materials of various fields including cosmetic materials, medical materials, and electric and electronic materials. In addition, recently, the transparency of a silicone resin has also attracted attention, and thus a silicone resin has also been used in a member requiring transparency such as a transparent sealing member of a light emitting diode. Examples of characteristics required for this use include optical characteristics, such as transparency and refractive index, and mechanical characteristics such as hardness.

For example, as techniques of conjugating a silicone resin and an inorganic material such as a metal oxide with each other to improve optical characteristics and mechanical characteristics, many techniques, for example, a transparent coating material for a photocatalyst (Patent Literature No. 1) which is obtained by conjugating titanium oxide particles with a silicone resin binder, a cosmetic material (Patent Literature No. 2) which is obtained by treating a surface of titanium oxide powder with an oil solution, a silicone compound, a fluorine compound, or the like in order to impart transparency, and the like are disclosed.

However, when a silicone resin and an inorganic material such as a metal oxide are conjugated with each other, in a case where any treatment is not performed on a surface of the metal oxide which is originally hydrophilic, the hydrophilic metal oxide does not have sufficient affinity to the highly hydrophobic silicone resin, and metal oxide particles agglomerate. As a result, there is a problem in that a uniform composite body cannot be obtained. Therefore, a conjugation method is discussed in which a surface of a metal oxide is modified with a hydrophobic dispersant, a reactive silicone, or the like to be hydrophobized such that affinity between the metal oxide and a silicone resin material is improved.

In such a composite body of a silicone resin and surface-modified metal oxide particles, in a case where a content rate of the metal oxide particles is increased to improve physical characteristics such as optical characteristics affected by the content of the metal oxide, there is a problem in that a content rate of a surface modifier is also increased along with an increase in the content rate of the metal oxide particle. In particular, in a case where metal oxide particles having a small particle diameter are used in order to maintain the transparency of a composite body, this problem becomes significant. Accordingly, a content rate of a silicone resin in a composite body may become excessively low, and thus hardness, flexibility, and the like which are largely affected by the silicone resin may be insufficient.

Further, it is more difficult to uniformly and finely disperse metal oxide particles of titanium oxide, zinc oxide, zirconium oxide, or the like having a relatively high refractive index and a high specific gravity in a silicone resin for conjugation, as compared to silica particles having the same siloxane skeleton as silicone and having a relatively similar refractive index to silicone. Accordingly, in a member having a relatively long optical path length such as a transparent sealing member, there is a problem in that it is difficult to simultaneously realize transparency and a high refractive index.

In order to solve the above-described problem, a technique (Patent Literature No. 3) relating to a metal oxide particle-silicone resin composite body having transparency, optical characteristics such as refractive index, and mechanical characteristics such as hardness in which surface-modified metal oxide particles are dispersed in a silicone resin is disclosed, the surface-modified metal oxide particles being obtained by modifying surfaces of metal oxide particles with a silane compound having a silicon-hydrogen bond (hydrosilyl group) and a saturated alkylsilane having a hydrophobic functional group.

CITATION LIST

Patent Literature

[Patent Literature No. 1] Japanese Laid-open Patent Publication No. 2002-60687
[Patent Literature No. 2] Japanese Laid-open Patent Publication No. 10-251123
[Patent Literature No. 3] Japanese Patent No. 5162879

SUMMARY OF INVENTION

Technical Problem

Here, according to the technique disclosed in Patent Literature No. 3, the metal oxide particle-silicone resin composite body having high transparency, a high refractive index, and a high mechanical strength can be obtained. However, the silane compound having a silicon-hydrogen bond (hydrosilyl group) which is used to modify the metal oxide particles has poor stability. Therefore, in particular, hydrogen gas may be produced during storage of the surface-modified metal oxide particle dispersion liquid or the surface-modified metal oxide particle-silicone resin composite composition, and there is room for improvement. For example, it is necessary to pay special attention to a storage state.

This invention has been made in order to solve the above-described problems, and an object thereof is to provide a surface-modified metal oxide particle dispersion liquid and a surface-modified metal oxide particle-silicone resin composite composition, which are used for obtaining a metal oxide particle-silicone resin composite body having optical characteristics, such as transparency and refractive index, and mechanical characteristics such as hardness and further having temporal stability. In addition, another object of this invention is to provide: a metal oxide particle-silicone resin composite body having optical characteristics, such as transparency and refractive index, and mechanical characteristics such as hardness and further having temporal stability; and an optical member and a light emitting device including the metal oxide particle-silicone resin composite body.

Solution to Problem

The inventors repeated investigations to solve the above-described problems and found that the problems can be solved by this invention described below, thereby completing this invention.

That is, this invention is as follows.

[1] A surface-modified metal oxide particle dispersion liquid including:
surface-modified metal oxide particles that are dispersed in a dispersion medium, the surface-modified metal oxide particles being obtained by modifying surfaces of metal oxide particles to have hydrosilyl groups, hydrophobic functional groups, and silanol groups,
in which a ratio of the hydrosilyl groups to the silanol groups is 5:95 or higher and 50:50 or lower.

[2] The surface-modified metal oxide particle dispersion liquid according to [1],
in which an average dispersed-particle diameter of the metal oxide particles is 1 nm or more and 20 nm or less.

[3] The surface-modified metal oxide particle dispersion liquid according to [1] or [2],
in which the metal oxide particles contain zirconium oxide, titanium oxide, or zinc oxide.

[4] The surface-modified metal oxide particle dispersion liquid according to any one of [1] to [3], further including:
an acid component,
in which a content of the acid component with respect to the surface-modified metal oxide particles is 1 ppm or higher and 100 ppm or lower.

[5] The surface-modified metal oxide particle dispersion liquid according to any one of [1] to [4],
in which a moisture content measured using a Karl Fischer moisture titrator is 5 ppm or higher and 200 ppm or lower.

[6] A method for producing a surface-modified metal oxide particle dispersion liquid including:
preparing surface-modified metal oxide particles by modifying surfaces of metal oxide particles using a hydrosilyl group-containing surface modifier which contains a hydrosilyl group and a hydrophobic functional group-containing surface modifier which contains a hydrophobic functional group, or using a combined surface modifier which contains both a hydrosilyl group and a hydrophobic functional group; and
hydrolyzing the surface-modified metal oxide particles in a dispersion medium such that hydrogen atoms in some of the hydrosilyl groups are substituted with hydroxyl groups to convert the hydrosilyl groups into silanol groups, and a ratio of the hydrosilyl groups to the silanol groups is 5:95 or higher and 50:50 or lower.

[7] The method for producing a surface-modified metal oxide particle dispersion liquid according to [6],
in which the hydrosilyl group-containing surface modifier is a silane compound containing both a hydrosilyl group and a hydrophobic functional group, the silane compound being represented by the following formula $H_rSiX_qY_{4-q-r}$, wherein X represents a saturated alkyl group represented by the following formula $C_nH_{2n+1}$ (where n represents an integer of 1 or more and 20 or less), a phenyl group, a cyclohexyl group, or a benzyl group, in a case where a plurality of X's are present, the X's may be the same as or different from each other;

Y represents chlorine, a hydroxyl group, an alkoxy group represented by the following formula $C_pH_{2p+1}O$ (where p represents an integer of 1 or more and 5 or less), an acetoxy group, a dimethylamino group, or a diethylamino group, in a case where a plurality of Y's are present, the Y's may be the same as or different from each other;

r represents an integer of 1 or 2;

q represents an integer of 1 or 2; and r+q represents an integer of 2 or 3.

[8] The method for producing a surface-modified metal oxide particle dispersion liquid according to [6] or [7],
in which the hydrophobic functional group-containing surface modifier is a silane compound containing a hydrophobic functional group, the silane compound being represented by the following formula $SiX_mY_{4-m}$, wherein X represents a saturated alkyl group represented by the following formula $C_nH_{2n+1}$ (where n represents an integer of 1 or more and 20 or less), a phenyl group, a cyclohexyl group, or a benzyl group, in a case where a plurality of X's are present, the X's may be the same as or different from each other;

Y represents chlorine, a hydroxyl group, an alkoxy group represented by the following formula $C_pH_{2p+1}O$ (where p represents an integer of 1 or more and 5 or less), or an acetoxy group, in a case where a plurality of Y's are present, the Y's may be the same as or different from each other; and m represents an integer of 1 or more and 3 or less.

[9] A surface-modified metal oxide particle-silicone resin composite composition including:
surface-modified metal oxide particles that are dispersed in an uncured silicone resin, the surface-modified metal oxide particles being obtained by modifying surfaces of metal oxide particles to have hydrosilyl groups, hydrophobic functional groups, and silanol groups,
in which a ratio of the hydrosilyl groups to the silanol groups is 5:95 or higher and 50:50 or lower.

[10] A surface-modified metal oxide particle-silicone resin composite composition including:
the surface-modified metal oxide particle dispersion liquid according to any one of [1] to [5]; and
a silicone resin.

[11] A surface-modified metal oxide particle-silicone resin composite body which is obtained by curing the surface-modified metal oxide particle-silicone resin composite composition according to [9] or [10].

[12] An optical member including:
the surface-modified metal oxide particle-silicone resin composite body according to [11].

[13] A light emitting device which is obtained by sealing a light emitting element with the surface-modified metal oxide particle-silicone resin composite body according to [11].

Advantageous Effects of Invention

According to this invention, it is possible to provide a surface-modified metal oxide particle dispersion liquid and a surface-modified metal oxide particle-silicone resin composite composition, which are used for obtaining a metal oxide particle-silicone resin composite body having optical characteristics, such as transparency and refractive index, and mechanical characteristics such as hardness and further having temporal stability. In addition, it is also possible to provide: a metal oxide particle-silicone resin composite body having optical characteristics, such as transparency and refractive index, and mechanical characteristics such as hardness and further having temporal stability; and an optical member and a light emitting device including the metal oxide particle-silicone resin composite body.

BRIEF DESCRIPTION OF DRAWING

FIG. 1 is a graph showing a relationship between a pressure increase and an elapsed time in a case where a surface-modified metal oxide particle toluene dispersion liquid according to each of Examples and Comparative Example 1 was stored in an airtight container at 45° C.

DESCRIPTION OF EMBODIMENTS

Hereinafter, an embodiment relating to a surface-modified metal oxide particle dispersion liquid, a method of producing the same, a surface-modified metal oxide particle-silicone resin composite composition, a surface-modified metal oxide particle-silicone resin composite body, an optical member, and a light emitting device according to this invention will be described.

The embodiment will be described in detail for easy understanding of the concept of this invention, but this invention is not limited thereto unless specified otherwise.

[1. Surface-Modified Metal Oxide Particle Dispersion Liquid and Method of Producing Same]

A surface-modified metal oxide particle dispersion liquid according to the embodiment includes surface-modified metal oxide particles that are dispersed in a dispersion medium, the surface-modified metal oxide particles being obtained by modifying surfaces of metal oxide particles to have hydrosilyl groups, hydrophobic functional groups, and silanol groups. A ratio of the hydrosilyl groups to the silanol groups is 5:95 or higher and 50:50 or lower.

Surface-modified metal oxide particles in the surface-modified metal oxide particle dispersion liquid are prepared by modifying surfaces of metal oxide particles with a surface modifier described below. Next, by hydrolyzing the surface-modified metal oxide particles, hydrosilyl groups, hydrophobic functional groups, and silanol groups are produced on surfaces of the surface-modified metal oxide particles.

Among these, the hydrosilyl groups function as organohydrogenpolysiloxane in an addition polymerization type silicone, and the hydrophobic functional groups function to cause the surface-modified metal oxide particles to be dispersed in polysiloxane (silicone resin) described below with high compatibility. In addition, due to the silanol groups, a condensation reaction between hydroxyl groups or between remaining hydrosilyl groups and remaining hydroxyl groups can be further accelerated.

By making the above-described three kinds of substituents to be present together and adjusting the ratio (molar ratio) of the hydrosilyl groups to the silanol groups to be 5:95 or higher and 50:50 or lower, the functions are exhibited in combination. As a result, a surface-modified metal oxide particle dispersion liquid and a surface-modified metal oxide particle-silicone resin composite composition are obtained, which are used for obtaining a metal oxide particle-silicone resin composite body having optical characteristics, such as transparency and refractive index, and mechanical characteristics such as hardness and further having temporal stability. In this specification, "having temporal stability" represents that hydrogen production in the surface-modified metal oxide particle dispersion liquid is suppressed. By preparing a metal oxide particle-silicone resin composite body using the surface-modified metal oxide particle dispersion liquid, the temporal stability of the composite body can be improved.

The ratio (molar ratio) of the hydrosilyl groups to the silanol groups is preferably 10:90 or higher and 40:60 or lower and more preferably 15:85 or higher and 30:70 or lower.

The ratio can be obtained by measuring the surface-modified metal oxide particle dispersion liquid according to the embodiment using a Fourier transform infrared spectrophotometer (FT-IR).

In addition, from the viewpoint of simultaneously realizing an effective reaction of the surface-modified metal oxide particles according to the embodiment with a silicone resin described below and compatibility with the silicone resin, the ratio (molar ratio) of the hydrosilyl groups to the hydrophobic functional groups is preferably 2:98 or higher and 40:60 or lower, more preferably 3:97 or higher and 22:78 or lower, and still more preferably 10:90 or higher and 22:78 or lower.

The ratio can be obtained by analyzing the surface-modified metal oxide particle dispersion liquid according to the embodiment by nuclear magnetic resonance (NMR).

It is preferable that the surface-modified metal oxide particles do not strongly agglomerate in order to maintain the transparency of a resin composite body described below. Therefore, the average dispersed-particle diameter of the surface-modified metal oxide particle dispersion liquid according to the embodiment is preferably 1 nm or more and 20 nm or less and more preferably 1 nm or more and 10 nm or less.

In a case where the average dispersed-particle diameter is 1 nm or more, deterioration in the crystallinity of primary particles of the metal oxide particles which form dispersed particles (agglomerated particles) is prevented, and particle characteristics such as refractive index are likely to be exhibited. In addition, in a case where the average dispersed-particle diameter is 20 nm or less, scattering caused by particles can be prevented from becoming severe. Therefore, in a case where a resin composite body described below is prepared using the surface-modified metal oxide particle dispersion liquid, deterioration in transparency can be suppressed.

The composition of the metal oxide particles is not particularly limited, and examples thereof include: oxides such as zirconium oxide ($ZrO_2$), titanium oxide ($TiO_2$), zinc oxide (ZnO), aluminum oxide ($Al_2O_3$), iron oxide ($Fe_2O_3$, FeO, $Fe_3O_4$), copper oxide (CuO, $Cu_2O$), yttrium oxide ($Y_2O_3$), niobium oxide ($Nb_2O_5$), molybdenum oxide ($MoO_3$), indium oxide ($In_2O_3$, $In_2O$), tin oxide ($SnO_2$), tantalum oxide ($Ta_2O_5$), tungsten oxide ($WO_3$, $W_2O_5$), lead oxide (PbO, $PbO_2$), bismuth oxide ($Bi_2O_3$), cerium oxide ($CeO_2$, $Ce_2O_3$), antimony oxide ($Sb_2O_3$, $Sb_2O_5$), germanium oxide ($GeO_2$, GeO) lanthanum oxide ($La_2O_3$), or ruthenium oxide ($RuO_2$); and composite oxides obtained by conjugating the oxides with other metals. In particular, zirconium oxide ($ZrO_2$), titanium oxide ($TiO_2$), or zinc oxide (ZnO) is preferable.

As the dispersion medium in which the surface-modified metal oxide particles are dispersed, an organic solvent is preferably used.

Examples of the organic solvent which can be preferably used include: alcohols such as methanol, ethanol, 2-propanol, butanol, or octanol; esters such as ethyl acetate, butyl acetate, ethyl lactate, propylene glycol monomethyl ether acetate, propylene glycol monoethyl ether acetate, or γ-butyrolactone; ethers such as diethyl ether, ethylene glycol monomethyl ether (methyl cellosolve), ethylene glycol monoethyl ether (ethyl cellosolve), ethylene glycol monobutyl ether (butyl cellosolve), diethylene glycol monomethyl ether, or diethylene glycol monoethyl ether; ketones such as acetone, methyl ethyl ketone, methyl isobutyl ketone, acetyl acetone, or cyclohexanone; aromatic hydrocarbons such as benzene, toluene, xylene, or ethyl benzene; and amides such as dimethylformamide, N,N-dimethylacetoacetamide, or N-methylpyrrolidone. Among these solvents, one kind or two or more kinds can be used.

The dispersion medium may further include a resin material such as a liquid resin monomer or a liquid resin oligomer. As the liquid resin monomer, for example, an acrylic or methacrylic monomer such as methyl acrylate or methyl methacrylate, or an epoxy monomer can be preferably used.

In addition, as the liquid resin oligomer, for example, a urethane acrylate oligomer, an epoxy acrylate oligomer, or an acrylate oligomer can be preferably used.

The content rate of the surface-modified metal oxide particles in the surface-modified metal oxide particle dispersion liquid is preferably 10% by mass or higher and 80% by mass or lower and more preferably 10% by mass or higher and 50% by mass or lower.

Here, the reason why the content rate of the surface-modified metal oxide particles is preferably 10% by mass or higher and 80% by mass or lower is that a highly dispersed state of the surface-modified metal oxide particle can be obtained in this range. In addition, in a case where the content rate is 10% by mass or higher, the effects of the surface-modified metal oxide particles can be maintained. In a case where the content rate is 50% by mass or lower, the occurrence of gelatification or coagulative precipitation can be further prevented, and characteristics as a dispersion liquid can be effectively exhibited.

Depending on the production process, the surface-modified metal oxide particle dispersion liquid according to the embodiment may include an acid component or a basic component.

Here, the acid component refers to a component which is bonded to $H^+$ to form an acid, and the basic component refers to a component which is bonded to $OH^-$ to form a base.

Optionally, for example, in order to improve the hydrolysis efficiency during the production, an acid or a base may be added to the surface-modified metal oxide particle dispersion liquid according to the embodiment. In this case, the surface-modified metal oxide particle dispersion liquid includes the acid component or the basic component.

The acid is a material which increases the proton ($H^+$) concentration when dissolved in water, and the base is a material which increases the hydroxide ion ($OH^-$) concentration when dissolved in water.

The acid component may be present in the surface-modified metal oxide particle dispersion liquid in the form of an acid, an ion, or a salt. Examples of the acid component include $Cl^-$ (chlorine), $NO_3^-$, $SO_4^{2-}$, and $COO^-$.

The basic component may be present in the surface-modified metal oxide particle dispersion liquid in the form of a base, an ion, or a salt. Examples of the basic component include amine, $NH_4^+$, $Ca^{2+}$, and $Na^+$.

A material of the acid component may be an inorganic acid or an organic acid. As the inorganic acid, for example, hydrochloric acid, nitric acid, or sulfuric acid can be used. In addition, as the organic acid, a fatty acid (monocarboxylic acid) can be preferably used. For example, formic acid, acetic acid, propionic acid, or butyric acid can be used.

As a material of the basic component, for example, ammonia, an amine compound, calcium hydroxide, or sodium hydroxide can be used.

Either or both of the acid component and the basic component may be present, and it is more preferable that the acid component is present. As the acid component, chlorine is preferable.

The content of the acid component is preferably 1 ppm or higher and 100 ppm or lower and more preferably 10 ppm or higher and 50 ppm or lower with respect to the surface-modified metal oxide particles.

The content of the basic component is preferably 1 ppm or higher and 100 ppm or lower and more preferably 10 ppm or higher and 50 ppm or lower with respect to the surface-modified metal oxide particles.

In a case where both the acid component and the basic component are present, the total content of the acid component and the basic component is preferably 1 ppm or higher and 100 ppm or lower and more preferably 10 ppm or higher and 50 ppm or lower with respect to the surface-modified metal oxide particles.

Here, the reason why the lower limit value is set as 1 ppm is to prevent conversion from hydroxyl groups to silanol groups from being delayed in a case where the content of the acid component or the basic component is 1 ppm or higher.

The reason why the upper limit value is set as 100 ppm is to prevent a metal mirror or the like of a light emitting element from being fogged through a reaction with the acid component or the basic component or to prevent corrosion of a semiconductor or a metal material.

The surface-modified metal oxide particle dispersion liquid according to the embodiment is produced using the following method of producing a surface-modified metal oxide particle dispersion liquid according to the embodiment.

That is, the method includes: preparing surface-modified metal oxide particles by modifying surfaces of metal oxide particles with a surface modifier described below; and hydrolyzing and dispersing the surface-modified metal oxide particles in a dispersion medium such that hydrogen atoms in some of the hydrosilyl groups are substituted with hydroxyl groups to convert the hydrosilyl groups into silanol groups; thereby, surfaces of the surface-modified metal oxide particles have hydrosilyl groups, hydrophobic functional groups, and silanol groups, and a ratio of the hydrosilyl groups to the silanol groups is 5:95 or higher and 50:50 or lower. Using this method, the surface-modified metal oxide particle dispersion liquid according to the embodiment is produced.

Hereinafter, the method of producing a surface-modified metal oxide particle dispersion liquid according to the embodiment will be described in more detail.

First, examples of the surface modifier according to the embodiment includes a hydrosilyl group-containing surface modifier which contains a hydrosilyl group, a hydrophobic functional group-containing surface modifier which contains a hydrophobic functional group, and a combined surface modifier which contains both a hydrosilyl group and a hydrophobic functional group. Regarding each of the hydrosilyl group-containing surface modifier and the hydrophobic functional group-containing surface modifier appropriately using these, one or more kinds are used in combination.

Regarding the combined surface modifier which contains both a hydrosilyl group and a hydrophobic functional group, one kind may be used, and two or more kinds may be used. In addition, the combined surface modifier which contains both a hydrosilyl group and a hydrophobic functional group and the hydrosilyl group-containing surface modifier which contains a hydrosilyl group may be used in combination. In addition, the combined surface modifier which contains both a hydrosilyl group and a hydrophobic functional group and the hydrophobic functional group-containing surface modifier may be used in combination. In addition, the combined surface modifier which contains both a hydrosilyl group and a hydrophobic functional group, the hydrosilyl group-containing surface modifier which contains a hydrosilyl group, and the hydrophobic functional group-containing surface modifier may be used in combination.

The hydrosilyl group-containing surface modifier contains a hydrosilyl group and is not particularly limited as long as it can modify the surfaces of the metal oxide particles.

It is preferable that the hydrosilyl group-containing surface modifier according to the embodiment is a silane compound having a hydrosilyl group. It is preferable that the hydrosilyl group-containing surface modifier according to the embodiment is a silane compound having a hydrosilyl group and a hydrophobic functional group. It is preferable that the silane compound having a hydrosilyl group and a hydrophobic functional group is a monomer.

The hydrosilyl group-containing surface modifier may be a silane compound containing a hydrosilyl group, the silane compound being represented by the following formula $H_rSiY_{4-r}$, wherein Y represents chlorine, a hydroxyl group, an alkoxy group represented by the following formula $C_pH_{2p+1}O$ (where p represents an integer of 1 or more and 5 or less), an acetoxy group, a dimethylamino group, or a diethylamino group, in a case where a plurality of Y's are present, the Y's may be the same as or different from each other; and r represents an integer of 1 or more and 3 or less. It is preferable that r represents 1.

The hydrosilyl group-containing surface modifier is a silane compound containing both a hydrosilyl group and a hydrophobic functional group, the silane compound being represented by the following formula $H_rSiX_qY_{4-q-r}$, wherein X (hydrophobic functional group) represents a saturated alkyl group represented by the following formula $C_nH_{2n+1}$ (where n represents an integer of 1 or more and 20 or less), a phenyl group, a cyclohexyl group, or a benzyl group, in a case where a plurality of X's are present, the X's may be the same as or different from each other; Y represents chlorine, a hydroxyl group, an alkoxy group represented by the following formula $C_pH_{2p+1}O$ (where p represents an integer of 1 or more and 5 or less), an acetoxy group, a dimethylamino group, or a diethylamino group, in a case where a plurality of Y's are present, the Y's may be the same as or different from each other; r represents an integer of 1 or 2; q represents an integer of 1 or 2; and r+q represents an integer of 2 or 3. It is preferable that r represents 1.

Representative examples of the silane compound containing a hydrosilyl group include trimethoxysilane, triethoxysilane, tripropoxysilane, and trisdimethylaminosilane.

Representative examples of the silane compound containing a hydrosilyl group and a hydrophobic functional group include methyldichlorosilane, ethyldichlorosilane, propyldichlorosilane, hexyldichlorosilane, decyldichlorosilane, dimethylchlorosilane, diethylethoxysilane, diethoxymethylsilane, phenyldichlorosilane, phenylmethylchlorosilane, methylphenylsilane, diphenylsilane, dimethyldimethylaminosilane, diethylaminodimethylsilane, bis(dimethylamino)methylsilane, diacetoxymethylsilane, diphenylchlorosilane, tripropylsilane, octylsilane, dimethylphenylsilane, butyldimethylsilane, triethylsilane, phenylsilane, dimethylaminomethylsilane, diethylmethylsilane, allyldimethylsilane, diethylsilane, diphenylmethylsilane, triphenylsilane, trihexylsilane, and 1,4-bis(dimethylsilyl)benzene.

In addition, it is preferable that the hydrophobic functional group-containing surface modifier is a silane compound containing a hydrophobic functional group (hereinafter also referred to as "hydrophobic functional group-containing silane compound"), the silane compound being represented by the following formula $SiX_mY_{4-m}$, wherein X (hydrophobic functional group) represents a saturated alkyl group represented by the following formula $C_nH_{2n+1}$ (where n represents an integer of 1 or more and 20 or less), a phenyl group, a cyclohexyl group, or a benzyl group, in a case where a plurality of X's are present, the X's may be the same as or different from each other; Y represents chlorine, a hydroxyl group, an alkoxy group represented by the following formula $C_pH_{2p+1}O$ (where p represents an integer of 1 or more and 5 or less), or an acetoxy group, in a case where a plurality of Y's are present, the Y's may be the same as or different from each other; and m represents an integer of 1 or more and 3 or less.

In other words, the hydrophobic functional group-containing surface modifier according to this invention is a surface modifier having no hydrosilyl group and having a hydrophobic functional group.

Representative examples of the hydrophobic functional group-containing silane compound as the hydrophobic functional group-containing surface modifier include methyltrichlorosilane, ethyltrichlorosilane, n-propyltrichlorosilane, hexyltrichlorosilane, octyltrichlorosilane, decyltrichlorosilane, octadecyltrichlorosilane, dimethyldichlorosilane, diethyldichlorosilane, hexylmethyldichlorosilane, decylmethyldichlorosilane, trimethylsilanol, triethylsilanol, triphenylsilanol, methyltrimethoxysilane, ethyltrimethoxysilane, propyltrimethoxysilane, butyltrimethoxysilane, isobutyltrimethoxysilane, hexyltrimethoxysilane, octyltrimethoxysilane, decyltrimethoxysilane, octadecyltrimethoxysilane, and phenyltrimethoxysilane.

In addition, other examples include methyltriethoxysilane, ethyltriethoxysilane, propyltriethoxysilane, butyltriethoxysilane, hexyltriethoxysilane, octyltriethoxysilane, decyltriethoxysilane, octadecyltriethoxysilane, phenyltriethoxysilane, benzyltriethoxysilane, acetoxytriethylsilane, acetoxytriphenylsilane, dimethoxydimethylsilane, diethoxydimethylsilane, dimethyldipropoxysilane, diethoxydiethylsilane, dimethoxydiphenylsilane, diethoxydiphenylsilane, dimethoxymethylphenylsilane, diethoxymethylphenylsilane, diethoxydodecylmethylsilane, dimethylethoxyphenylsilane, methoxytrimethylsilane, methoxytriethylsilane, and ethoxytriphenylsilane.

It is preferable that the combined surface modifier which contains both a hydrosilyl group and a hydrophobic functional group is a combined siloxane compound having both a hydrosilyl group and a hydrophobic functional group (hereinafter, also referred to as "combined siloxane compound"). It is preferable that this combined siloxane compound having a hydrosilyl group and a hydrophobic functional group is a monomer.

Representative examples of the combined siloxane compound include 1,1,3,3-tetramethyldisiloxane, 1,1,3,3,5,5-hexamethylcyclotrisiloxane, 1,1,1,3,5,5,5-heptamethyltrisiloxane, 1,3,5,7-tetramethylcyclotetrasiloxane, 1,1,1,3,5,7,7,7-octamethyltetrasiloxane, tris(trimethylsiloxy)silane, 1,3,5,7,9-pentamethylcyclopentasiloxane, hydrosilyl group-containing dimethylsiloxane, hydrosilyl group-containing methylphenylsiloxane, and hydrosilyl group-containing diphenylsiloxane.

In a case where a silicone resin having a phenyl group is used as a silicone resin (polymer as a base) in a surface-modified metal oxide particle-silicone resin composite body described below, it is preferable that a surface modifier having a phenyl group is selected among the above-described surface modifiers according to the embodiment. The reason for this is to prevent the surface modifier itself from causing a decrease in the refractive index with respect to the refractive index of the silicone resin having a phenyl group.

The surfaces of the metal oxide particles are modified with the surface modifier according to the embodiment. In a case where the hydrosilyl group-containing surface modifier and the hydrophobic functional group-containing surface modifier are used in combination, it is preferable that the amount of the hydrosilyl group-containing surface modifier required for the surface modification is preferably 1% by mass or higher and 15% by mass or lower and the amount of the hydrophobic functional group-containing surface modifier required for the surface modification is preferably 10% by mass or higher and 90% by mass or lower with respect to the total mass of the metal oxide particles. By modifying the surfaces of the metal oxide particles with the surface modifier under the above-described conditions, a function as a crosslinking agent for a silicone resin and hydrophobicity can be imparted to the metal oxide particles with a good balance. The total amount of the hydrosilyl group-containing surface modifier and the hydrophobic functional group-containing surface modifier is more preferably 100% by mass or lower with respect to the total mass of the metal oxide particles.

In addition, in order not only to impart the function as a crosslinking agent for a silicone resin and hydrophobicity but also to adjust compatibility or crosslinking properties to, for example, a specific silicone resin, another surface modifier may be used in addition to the hydrosilyl group-containing surface modifier and the hydrophobic functional group-containing surface modifier. In this case, the total content of the hydrosilyl group-containing surface modifier, the hydrophobic functional group-containing surface modifier, and the other surface modifier is preferably 11% by mass or higher and 150% by mass or lower with respect to the total mass of the metal oxide particles. In addition, the total amount of the hydrosilyl group-containing surface modifier and the hydrophobic functional group-containing surface modifier is preferably 11% by mass or higher and 100% by mass or lower with respect to the total mass of the metal oxide particles. By modifying the surfaces of the metal oxide particles under the above-described conditions, the function as a crosslinking agent and hydrophobicity can be imparted with a good balance, characteristics of the other surface modifier can be exhibited, and the effects as the metal oxide particles can also be sufficiently exhibited. As the other surface modifier, an organic silane compound is preferable. In particular, a functional group having bindability to a silicone resin described below, for example, an organic silane compound having an unsaturated group such as an alkenyl group is preferable. In addition, an organic silane compound which contains an unsaturated alkyl group having 1 or more and 3 or less carbon atoms is also preferable.

In a case where the combined surface modifier which contains both a hydrosilyl group and a hydrophobic functional group (hereinafter, also referred to as "combined surface modifier") is used, the amount of the combined surface modifier required for the surface modification is not particularly limited and is preferably 1% by mass or higher and 100% by mass or lower with respect to the total mass of the metal oxide particles. By modifying the surfaces of the metal oxide particles with the combined surface modifier under the above-described conditions, the function as a crosslinking agent for a silicone resin and the function of imparting hydrophobicity to the metal oxide particles can be imparted with a good balance.

In addition, in order not only to impart the function as a crosslinking agent for a silicone resin and the function of imparting hydrophobicity to the metal oxide particles but also to adjust compatibility or crosslinking properties to, for example, a specific silicone resin, another surface modifier may be used in addition to the combined surface modifier. In this case, the total content of the combined surface modifier and the other surface modifier is preferably 11% by mass or higher and 150% by mass or lower with respect to the total mass of the metal oxide particles. By modifying the surfaces of the metal oxide particles under the above-described conditions, the function as a crosslinking agent and hydrophobicity can be imparted with a good balance, characteristics of the other surface modifier can be exhibited, and the effects as the metal oxide particles can also be sufficiently exhibited.

As the other surface modifier, an organic silane compound is preferable. In particular, a functional group having bindability to a silicone resin described below, for example, an organic silane compound having an unsaturated group such as an alkenyl group is preferable. In addition, an organic silane compound which contains an unsaturated alkyl group having 1 or more and 3 or less carbon atoms is also preferable.

As a method of treating the metal oxide particles with the surface modifier according to the embodiment, both a dry method and a wet method can be used. As the dry method, for example, a method of modifying the surfaces of the metal oxide particles by putting the surface modifier according to the embodiment and the metal oxide particles into a dry mixer such as a HENSCHEL mixer and mixing them with each other can be used.

In addition, as the wet method, for example, a method of modifying the surfaces of the metal oxide particles by mixing the surface modifier according to the embodiment and the metal oxide particles with each other in a solvent can be used.

In either method, by causing them to react with each other while heating them, the surfaces of the metal oxide particles can be more efficiently modified. In addition, in a case where the hydrosilyl group-containing surface modifier and the hydrophobic functional group-containing surface modifier are used in combination, the surfaces of the metal oxide particles may be modified after the components are mixed with each other or while the components are simultaneously or sequentially being mixed with each other. That is, the surfaces of the metal oxide particles only have to be modified after the hydrosilyl groups and the hydrophobic functional groups are mixed with each other in the end.

In addition, the surfaces of the metal oxide particles may be preliminarily treated before being treated with the surface modifier according to the embodiment. As a result, the dispersibility in a dispersion medium can be improved. As the surface modifier for the preliminary surface modification, the hydrophobic functional group-containing surface modifier, the combined surface modifier, or the like according to the embodiment can also be used. As the surface modifier for the preliminary surface treatment, an alkoxysilane is preferable, and an alkoxysilane having 1 or more and 10 or less carbon atoms is preferable. As the alkoxysilane, for example, one kind or two or more kinds selected from the group consisting of methyltrimethoxysilane, ethyltrimethoxysilane, propyltrimethoxysilane, isobutyltrimethoxysilane, pentyltrimethoxysilane, hexyltrimethoxysilane, and phenyltrimethoxysilane can be used.

In the surface-modified metal oxide particle dispersion liquid according to the embodiment, hydrogen atoms in some of the hydrosilyl groups of the surfaces modified with the hydrosilyl group-containing surface modifier or the combined surface modifier are substituted with hydroxyl groups so as to convert some of the hydrosilyl groups into silanol groups. Here, the expression "substituted . . . to convert" represents that the hydroxyl groups are bonded to silicon after removing hydrogen therefrom through hydrolysis or the like so as to obtain silanol groups. The substitution degree may be appropriately adjusted such that the ratio of the hydrosilyl groups to the silanol groups is 5:95 or higher and 50:50 or lower.

By a large amount of silanol groups being produced as described above, a condensation reaction between hydroxyl groups or between remaining hydrosilyl groups and remaining hydroxyl groups can be further accelerated. As a hydrolysis method, a hydrolysis method of obtaining silanol groups by causing hydrosilyl groups to react with water directly may be used. In addition, a hydrolysis method of obtaining another functional group first and then obtaining a silanol group from the other functional group may also be used. For example, alkoxy groups are produced by causing hydrosilyl groups to react with alcohol, and then silanol groups are finally obtained from the alkoxy groups.

In this way, some of hydrosilyl groups are converted into silanol groups by modifying the surfaces of the metal oxide particles appropriately using the hydrosilyl group-containing surface modifier, the hydrophobic functional group-containing surface modifier, and the combined surface modifier. As a result, the surface-modified metal oxide particle dispersion liquid according to the embodiment can be obtained.

As described above, due to the hydrosilyl groups in the hydrosilyl group-containing surface modifier, the metal oxide particles can function as a crosslinking agent (organohydrogenpolysiloxane) for an addition polymerization type silicone. However, the presence of an excess amount of hydrosilyl groups may produce hydrogen, which causes deterioration in temporal stability. That is, the hydrosilyl groups are slowly hydrolyzed by a small amount of moisture, an acid, or a base present in the metal oxide particle dispersion liquid, release hydrogen, and are converted into silanol groups by substitution. Therefore, there is a risk of container breakage or ignition, and it is necessary to pay attention to a storage environment, for example, refrigerated storage.

If moisture, an acid, or a base can be completely removed from the metal oxide particle dispersion liquid, the remaining of an excess amount of hydrosilyl group does not cause any problem. However, it is extremely difficult to completely remove moisture from the metal oxide particle dispersion liquid. In addition, an acid or a base may be incorporated from raw materials of the metal oxide particles or may be required to be added during the production. Therefore, it is difficult to remove an acid or a base from the metal oxide particle dispersion liquid.

In addition, it is not preferable that an excess amount of hydrosilyl groups are removed from the metal oxide particle dispersion liquid because, in a case where a composite body is prepared by mixing the metal oxide particle dispersion liquid with a silicone resin, the mechanical strength thereof is poor.

In the surface-modified metal oxide particle dispersion liquid according to this invention, the ratio of the hydrosilyl groups to the silanol groups is in the predetermined range. Therefore, the production of hydrogen is suppressed, temporal stability is excellent, and characteristics of a composite body of the surface-modified metal oxide particle dispersion liquid and a silicone resin are also excellent.

The ratio of the hydrosilyl groups to the silanol groups in the surface-modified metal oxide particle according to the embodiment is 5:95 or higher and 50:50 or lower. In order to obtain this ratio, the amount of the surface modifier according to the embodiment or the amount of moisture added may be adjusted.

After the surface modification, hydrolysis is performed in a dispersion medium. As a method of removing hydrogen from the hydrosilyl groups by hydrolysis or the like to finally obtain silanol groups, a method of adding moisture to a dispersion liquid before hydrolysis and accelerating the hydrolysis reaction by heating or the like is preferable. The addition amount of moisture is preferably 50 ppm or higher and 10000 ppm or lower and more preferably 100 ppm or higher and 5000 ppm or lower with respect to the surface-modified metal oxide particles.

The surfaces of the metal oxide particles are modified with the surface modifier according to the embodiment, and the hydrolysis reaction is accelerated by the addition of moisture. As a result, the surface-modified metal oxide particle dispersion liquid according to the embodiment contains moisture. In the surface-modified metal oxide particle dispersion liquid according to the embodiment, a moisture content measured using a Karl Fischer moisture titrator (Model No.: AQ-2000, manufactured by Hiranuma Sangyo Co., Ltd.) is preferably 5 ppm or higher and 200 ppm or lower and more preferably 6 ppm or higher and 150 ppm or lower.

In order to convert hydrosilyl groups into silanol groups, it is preferable that the dispersion liquid before hydrolysis contains an acid or a base because the hydrolysis reaction is accelerated.

Since examples of the acid or the base are the same as described above, the description thereof will not be repeated.

[2. Surface-Modified Metal Oxide Particle-Silicone Resin Composite Composition and Surface-Modified Metal Oxide Particle-Silicone Resin Composite Body]

A first embodiment of the surface-modified metal oxide particle-silicone resin composite composition (hereinafter, also referred to as "resin composite composition") according to this invention includes surface-modified metal oxide particles that are dispersed in an uncured silicone resin, the surface-modified metal oxide particles being obtained by modifying surfaces of metal oxide particles to have hydrosilyl groups, hydrophobic functional groups, and silanol groups, in which a ratio of the hydrosilyl groups to the silanol groups is 5:95 or higher and 50:50 or lower.

The content of the surface-modified metal oxide particles in the resin composition is not particularly limited. In order to exhibit characteristics of the metal oxide particles and characteristics of the silicone resin with a good balance, the content of the surface-modified metal oxide particles is preferably 30% by mass or higher and 80% by mass or lower and 35% by mass or higher and 60% by mass or lower with respect to the total mass of the surface-modified metal oxide particles and the silicone resin.

In addition, a second embodiment of the surface-modified metal oxide particle-silicone resin composite composition includes the surface-modified metal oxide particle dispersion liquid according to the embodiment and a silicone resin.

Optionally a dispersion medium may be removed from the surface-modified metal oxide particle-silicone resin composite composition. That is, the dispersion medium may be completely removed, or may be removed such that 1% by mass or higher and 10% by mass or lower of the dispersion medium remains or 2% by mass or higher and 5% by mass or lower of the dispersion medium remains in the composition.

The content of the surface-modified metal oxide particles in the resin composition is not particularly limited. In order to exhibit characteristics of the metal oxide particles and characteristics of the silicone resin with a good balance, the content of the surface-modified metal oxide particles is preferably 30% by mass or higher and 80% by mass or lower and 35% by mass or higher and 60% by mass or lower with respect to the total mass of the surface-modified metal oxide particles and the silicone resin.

The ratio (molar ratio) of the hydrosilyl groups to the silanol groups in the resin composition can be obtained by measuring the resin composition using a Fourier transform infrared spectrophotometer (FT-IR).

In addition, the ratio (molar ratio) of the hydrosilyl groups to the hydrophobic functional groups in the resin composition can be obtained by analyzing the resin composition by nuclear magnetic resonance (NMR).

The silicone resin is not particularly limited as long as it is a silicone resin capable of addition polymerization reaction with the hydrosilyl groups. For example, a silicone resin which contains a group having an unsaturated bond can be used.

The addition polymerization type silicone resin is curable within a short period of time, has an advantageous effect in that a by-product is not produced therefrom, and can be applied to a wide range of uses. In particular, the addition polymerization type silicone resin is preferable as a sealing member with which a light emitting element is sealed.

As the group having an unsaturated bond, for example, an alkenyl group such as a vinyl group, an allyl group, a pentenyl group, or a hexenyl group is preferable. As the silicone resin, an alkyl alkenyl polysiloxane having two or more vinyl groups in one molecule can be more preferably used.

In order to impart characteristics, the silicone resin may contain a functional group which is not used for the addition reaction. For example, in order to increase the refractive index, the silicone resin may contain a phenyl group.

As the silicone resin according to the embodiment, for example, a vinyl group-containing methylphenylpolysiloxane, a vinyl group-containing dimethylpolysiloxane, or a vinyl group-containing diphenylpolysiloxane can be used.

Within a range where the object of this invention does not deteriorate, the resin composite composition according to the embodiment may contain a crosslinking agent such as organohydrogensiloxane, or a hydrosilylation reaction catalyst for accelerating a hydrosilylation reaction such as a platinum catalyst, a rhodium catalyst, or a palladium catalyst.

By applying energy to the resin composition according to the embodiment, an addition polymerization reaction between a hydrosilyl group and a group having an unsaturated bond is carried out to cure the silicone resin.

A method of applying energy is not particularly limited. For example, by heating the resin composite composition according to the embodiment, the silicone resin is cured.

The viscosity of the silicone resin is preferably 10 cps or higher and 100000 cps or lower, more preferably 100 cps or higher and 10000 cps or lower, and still more preferably 1000 cps or higher and 5000 cps or lower.

As a method of producing the first embodiment of the surface-modified metal oxide particle-silicone resin composite composition, a method of removing the dispersion medium after stirring and mixing the surface-modified metal oxide particle dispersion liquid and the silicone resin with each other is preferable from the viewpoint of obtaining high dispersibility in the silicone resin. In order to remove the dispersion medium, for example, a vacuum dryer can be used.

In addition, a method of directly kneading and dispersing the surface-modified metal oxide particles in the silicone resin to obtain the surface-modified metal oxide particle-silicone resin composite composition can also be used. The surface-modified metal oxide particles can be obtained, for example, by removing the dispersion medium from the surface-modified metal oxide particle dispersion liquid in advance. In a method of kneading the surface-modified metal oxide particle with the silicone resin, for example, a kneading machine or a kneader can be used.

In addition, in a method of producing the second embodiment of the surface-modified metal oxide particle-silicone resin composite composition according to this invention, the surface-modified metal oxide particle dispersion liquid according to this invention and the silicone resin are mixed with each other. In a case where a cured product is obtained from the resin composite composition according to the embodiment, it is preferable that a solvent (the dispersion medium in the dispersion liquid) is removed from the composition from the viewpoint of easy molding.

In addition, the surface-modified metal oxide particle-silicone resin composite body according to the embodiment is obtained by curing the surface-modified metal oxide particle-silicone resin composite composition (cured product of the surface-modified metal oxide particle-silicone resin composite composition) according to the embodiment.

The content of the surface-modified metal oxide particles in the resin composite body is not particularly limited. In order to exhibit characteristics of the metal oxide particles and characteristics of the silicone resin with a good balance, the content of the surface-modified metal oxide particles is preferably 30% by mass or higher and 80% by mass or lower and 35% by mass or higher and 60% by mass or lower with respect to the total mass of the surface-modified metal oxide particles and the silicone resin.

In a method of producing the surface-modified metal oxide particle-silicone resin composite body according to the embodiment, the surface-modified metal oxide particle-silicone resin composite body is obtained by heating the silicone resin composite composition according to the embodiment. A heating temperature and a heating time may be appropriately determined depending on the characteristics of the silicone resin used.

[3. Optical Member]

An embodiment of the optical member according to this invention includes the surface-modified metal oxide particle-silicone resin composite body according to the embodiment, and examples thereof include a microlens.

In order to obtain the surface-modified metal oxide particle-silicone resin composite body for an optical member, the resin composition according to the embodiment is filled into a mold, a package, or the like and the is cured. A curing method may be selected depending on a resin material to be used, a curing catalyst, and the like without any particular limitation. For example, a thermal curing method by heating may be used.

[4. Light Emitting Device]

In an embodiment of the light emitting device according to this invention, a light emitting element is sealed with the surface-modified metal oxide particle-silicone resin composite body according to this invention.

Specifically, a light emitting element (chip) such as a light emitting diode is sealed with the resin composite body.

In a portion of the light emitting device according to the embodiment which is sealed with the resin composite body, for example, in a case where the optical path length is 1 mm, it is preferable that the portion is transparent to visible light, and it is more preferable that the total light transmittance is 50% or higher. In the light emitting device according to the embodiment, the sealing portion is formed of the resin composite body. Therefore, optical characteristics such as refractive index and mechanical characteristics such as hardness can be exhibited while maintaining transparency. As a result, even in a case where the refractive index of the light emitting element is high, light loss at an interface between the light emitting element and the resin composite body can be suppressed, and the light extraction efficiency can be improved.

In addition, in the resin composite body, the compatibility between the surface-modified metal oxide particles and the silicone resin can be adjusted by selecting the surface modifier of the surface-modified metal oxide particles and the silicone resin. As a result, aggregates of the surface-modified metal oxide particles can be formed. In this case, the resin composite body can be used as a scattering agent for efficiently scattering light emitted from the light emitting element.

As a method of adjusting the compatibility, for example, a method of using a surface modifier having a hydrophilic functional group or a method of using a silicone resin having a high molecular weight which is not likely to be mixed with the metal oxide particles may be used. It is preferable that the aggregate (agglomerate) particle diameter of the aggregates of the surface-modified metal oxide particle is 50 nm or more and 200 nm or less.

EXAMPLES

Hereinafter, this invention will be described in detail using Examples and Comparative Examples but is not limited to the following Examples.

[Synthesis Example of Zirconium Oxide Particles]

2615 g of zirconium oxychloride octahydrate was dissolved in 40 L (liter) of pure water to prepare an aqueous zirconium salt solution, 344 g of 28% ammonia water was dissolved in 20 L of pure water to prepare a dilute ammonia water, and the dilute ammonia water was added to the aqueous zirconium salt solution while stirring them. As a result, a zirconium oxide precursor slurry was prepared.

Next, 300 g of sodium sulfate was dissolved in 5 L of pure water to prepare an aqueous sodium sulfate solution, and this aqueous sodium sulfate solution was added to the slurry while stirring them. At this time, the addition amount of the sodium sulfate was 30% by mass with respect to the amount of zirconium ions in the aqueous zirconium salt solution in terms of zirconium oxide.

Next, using a dryer, this mixture was dried in air at 130° C. for 24 hours to obtain a solid. Next, this solid was crushed using an automated mortar or the like and was calcinated using an electric furnace in air at 500° C. for 1 hour.

Next, this calcinated product was put into pure water and was stirred to prepare a slurry. After the added sodium sulfate was sufficiently removed by cleaning using a centrifugal separator, the slurry was dried using a dryer. As a result, zirconium oxide particles (Z1) were prepared.

The average primary particle diameter of the zirconium oxide particles (Z1) measured using a transmission electron microscope was 5 nm.

Example 1

70 parts by mass of ion exchange water and 10 parts by mass of a 0.1 N aqueous hydrochloric acid solution were added to 20 parts of the zirconium oxide particles (Z1), and the components were stirred at a high speed. As a result, an aqueous zirconium oxide particle dispersion liquid was prepared.

Next, surfaces of the zirconium oxide particles were modified by adding 20 parts by mass of a methanol solution in which 5 parts by mass of isobutyltrimethoxysilane (hydrophobic functional group-containing silane compound) was dissolved and stirring them at 60° C. for 3 hours. As a result, a zirconium oxide particle dispersion liquid modified with isobutyltrimethoxysilane was prepared.

Next, after solid-liquid separation, the solid was cleaned with 10 L of ion exchange water using a filtering device. As a result, a zirconium oxide cake modified with isobutyltrimethoxysilane was obtained.

Next, this zirconium oxide cake was dried in a vacuum dryer at 60° C. for 24 hours. As a result, zirconium oxide powder modified with isobutyltrimethoxysilane was obtained.

Next, 65 parts by mass of toluene, 4 parts by mass of phenyltrimethoxysilane (hydrophobic functional group-containing silane compound), and 1 part by mass of diphenylchlorosilane (hydrosilyl group and hydrophobic functional group-containing silane compound) were added to 25 parts by mass of the zirconium oxide powder modified with isobutyltrimethoxysilane, and the components were stirred at a high speed. As a result, a zirconium oxide toluene dispersion liquid modified with phenyltrimethoxysilane and diphenylsilane was prepared.

Next, 1 part by mass of pure water was added to 95 parts by mass of the surface-modified zirconium oxide toluene dispersion liquid, and the components were stirred at 60° C. for 24 hours. As a result, a surface-modified metal oxide particle toluene dispersion liquid in which some of hydrosilyl groups were converted into silanol groups was prepared.

The average dispersed-particle diameter of the metal oxide particles in the dispersion liquid measured using a dynamic light scattering particle diameter distribution analyzer (manufactured by Malvern Instruments Ltd.) was 10 nm.

Next, 24 parts by mass of a vinyl group-containing methylphenylpolysiloxane having a viscosity of 3000 cps was added to 96 parts by mass of the dispersion liquid, and the components were slightly stirred and dissolved. Next, chloroplatinic acid as a curing catalyst was added such that the concentration thereof was 20 ppm with respect to the vinyl group-containing methylphenylpolysiloxane. Next, toluene was evaporated under reduced pressure. As a result, a silicone resin composition in which the surface-modified zirconium oxide was dispersed was obtained.

Next, this composition was filled into a flat-bottomed container such that the thickness thereof was 1 mm, and then was heated at 150° C. for 2 hours to cure the composition. As a result, a surface-modified zirconium oxide-silicone resin composite body according to Example 1 was obtained.

Example 2

A surface-modified metal oxide particle toluene dispersion liquid and a surface-modified zirconium oxide-silicone resin composite body according to Example 2 were obtained using the same method as in Example 1, except that the amount of pure water added to the surface-modified zirconium oxide toluene dispersion liquid was changed from 1 part by mass to 0.2 parts by mass.

Example 3

A surface-modified metal oxide particle toluene dispersion liquid and a surface-modified zirconium oxide-silicone resin composite body according to Example 3 were obtained using the same method as in Example 1, except that the amount of pure water added to the surface-modified zirconium oxide toluene dispersion liquid was changed from 1 part by mass to 3 parts by mass.

Comparative Example 1

70 parts by mass of toluene, 1 part by mass of phenylmethylchlorosilane, and 5 parts by mass of phenyltrimethoxysilane were added to 20 parts by mass of the zirconium oxide particles (Z1). Next, the components were heated at 60° C. and were stirred at a high speed. As a result, a zirconium oxide toluene dispersion liquid modified with phenylmethylchlorosilane (hydrosilyl group-containing silane compound) and phenyltrimethoxysilane (hydrophobic functional group-containing silane compound) was prepared.

The average dispersed-particle diameter of the metal oxide particles in the dispersion liquid measured using a dynamic light scattering particle diameter distribution analyzer (manufactured by Malvern Instruments Ltd.) was 10 nm.

Next, 24 parts by mass of a vinyl group-containing methylphenylpolysiloxane having a viscosity of 3000 cps was added to 96 parts by mass of the dispersion liquid, and the components were slightly stirred and dissolved. Next, chloroplatinic acid as a curing catalyst was added such that the concentration thereof was 20 ppm with respect to the vinyl group-containing methylphenylpolysiloxane. Next, toluene was evaporated under reduced pressure. As a result, a non-hydrolyzed silicone resin composition in which the surface-modified zirconium oxide was dispersed was obtained.

Next, this composition was filled into a flat-bottomed container such that the thickness thereof was 1 mm, and then was heated at 150° C. for 2 hours to cure the composition. As a result, a surface-modified zirconium oxide-silicone resin composite body according to Comparative Example 1 was obtained.

Comparative Example 2

Next, 3 parts by mass of pure water was added to 96 parts by mass of the surface-modified zirconium oxide toluene dispersion liquid which was prepared using the same method as in Comparative Example 1, and the components were stirred at 60° C. for 24 hours. As a result, a surface-modified metal oxide particle toluene dispersion liquid according to Comparative Example 2 in which some of hydrosilyl groups were converted into silanol groups was prepared. Next, using the same method as in Example 1, a surface-modified zirconium oxide-silicone resin composite body according to Comparative Example 2 was obtained.

The average dispersed-particle diameter of the metal oxide particles in the dispersion liquid measured using a dynamic light scattering particle diameter distribution analyzer (manufactured by Malvern Instruments Ltd.) was 11 nm.

Comparative Example 3

A surface-modified metal oxide particle toluene dispersion liquid and a surface-modified zirconium oxide-silicone resin composite body according to Comparative Example 3 were obtained using the same method as in Example 1, except that the amount of pure water added to the surface-modified zirconium oxide toluene dispersion liquid was changed from 1 part by mass to 0.1 parts by mass.

[Evaluation]

Regarding the surface-modified metal oxide particle toluene dispersion liquid according to each of Examples 1 to 3 and Comparative Examples 1 to 3, the chlorine content and the ratio of hydrosilyl groups to silanol groups were evaluated using the following device or method. The results are shown in Table 1.

Regarding the surface-modified metal oxide particle toluene dispersion liquid according to each of Examples 1 to 3 and Comparative Examples 1 to 3, the ratio of hydrosilyl groups to hydrophobic functional groups were evaluated using the following device. The results are shown in Table 2.

In addition, the moisture content of each of the surface-modified metal oxide particle toluene dispersion liquid according to each of Examples 1 to 3 and Comparative Example 3 was measured using a Karl Fischer moisture titrator (Model No.: AQ-2000, manufactured by Hiranuma Sangyo Co., Ltd.). The results are shown in Table 2.

In addition, 0.85 L of each of the surface-modified metal oxide particle toluene dispersion liquid according to each of Examples 1 to 3 and Comparative Example 1 was put into a 1 L container, the container was sealed, and the internal pressure of the airtight container was monitored using a pressure gauge equipped in the container. In a case where the dispersion liquid was stored in the airtight container at 45° C., an internal pressure increase was measured over time, and the measurement results are shown in FIG. 1.

In addition, the surface-modified metal oxide particle toluene dispersion liquid according to each of Examples 1 to 3 and Comparative Example 3 was put into a metal container, and the metal container was sealed with a cover equipped with a pressure gauge and was stored at 23° C. The results are as follows, In Comparative Example 3, the internal pressure of the container was increased over time. However, in Examples 1 to 3, the internal pressure of the container was not substantially increased over time, and it was found that temporal stability was excellent.

Further, regarding each of the surface-modified zirconium oxide-silicone resin composite bodies, four factors including the total light transmittance, the refractive index, the hardness-tensile strength, and the water absorption were evaluated using the following device or method, and the evaluation results are shown in Table 3.

(1) Chlorine Content

The surface-modified metal oxide particle toluene dispersion liquid according to each of Examples and Comparative Examples was converted into gas by burning it using an oxygen-tube combustion method. This gas was collected as ions or the like in an absorbent and was analyzed using an ion chromatograph (SQ-1 type/HSU-35 type (manufactured by Anatec Yanaco Corporation) and ICS-2000 (manufactured by Dionex Corporation)). As a result, the total chlorine content in each of the dispersion liquids was measured. The chlorine content in the dispersion liquid was converted into the chlorine content in the surface-modified metal oxide particles.

(2) Ratio (Molar Ratio) of Hydrosilyl Groups to Silanol Groups

The surface-modified metal oxide particle toluene dispersion liquid according to each of Examples and Comparative Examples was measured using a FT-IR method. That is, using a Fourier transform infrared spectrophotometer (Model No.: FT/IR-670, manufactured by Jasco Corporation), each of the dispersion liquids was measured according to a liquid membrane technique, and a ratio of the area of an absorption peak of about 2200 cm$^{-1}$ derived from hydrosilyl groups and the area of an absorption peak of about 3500 to 3700 cm$^{-1}$ derived from silanol groups was calculated.

(3) Ratio of Hydrosilyl Groups to Hydrophobic Functional Groups

The surface-modified metal oxide particle toluene dispersion liquid according to each of Examples and Comparative Examples was dissolved in heavy chloroform, and this solution was analyzed by nuclear magnetic resonance (NMR; Model NO.: JNM-EX400, manufactured by Jeol Ltd.) to obtain the ratio.

Table 2 shows a proton ratio (hydrosilyl groups/hydrophobic functional groups) which was calculated from signals derived from hydrosilyl groups and hydrophobic functional groups, and also shows a molar ratio (hydrosilyl groups: hydrophobic functional groups) converted from the proton ratio.

(4) Moisture

The moisture content of each of the surface-modified metal oxide particle toluene dispersion liquid according to each of Examples 1 to 3 and Comparative Example 3 was measured using a Karl Fischer moisture titrator (Model No.: AQ-2000, manufactured by Hiranuma Sangyo Co., Ltd.).

(5) Total Light Transmittance

According to JIS K 7136-1 "Plastics-Determination of Total Light Transmittance for Transparent Materials", the total light transmittance of the resin composite body according to each of Examples and Comparative Examples was measured using a hazemeter NDH-2000 (manufactured by Nippon Denshoku Industries Co., Ltd.). Here, a case where the total light transmittance was 70% or higher was evaluated as "O", and a case where the total light transmittance was lower than 70% was evaluated as "X". The higher the total light transmittance, the better. Therefore, "O" represents a good product, and "X" represents a product having lower performance than the good product.

(6) Refractive Index

According to JIS K 7142 "Plastics-Determination of Refractive Index", the refractive index of the resin composite body according to each of Examples and Comparative Examples was measured using an Abbe refractometer.

Here, as compared to a standard sample, a case where the refractive index was increased by 0.05 or higher was evaluated as "O", and a case where the refractive index was increased by lower than 0.05 was evaluated as "X". "O" represents a good product, and "X" represents a product having lower performance than the good product.

The standard sample was particle: 0% by mass and was prepared as follows.

Next, 10 parts by mass of a hydrosilyl group-containing polysiloxane having a viscosity of 30 cps was added to 90 parts by mass of a vinyl group-containing methylphenylpolysiloxane having a viscosity of 3000 cps, and the components were slightly stirred. Next, chloroplatinic acid as a curing catalyst was added such that the concentration thereof was 20 ppm with respect to the vinyl group-containing methylphenylpolysiloxane. As a result, a silicone resin composition was obtained.

Next, this composition was filled into a flat-bottomed container such that the thickness thereof was 1 mm, and then was heated at 150° C. for 2 hours to cure the composition. As a result, a silicone resin composite body as the standard sample was obtained.

(7) Hardness-Tensile Strength

According to JIS K 6249 "Testing Methods for Uncured and Cured Silicone Rubber", the hardness-tensile strength of the surface-modified zirconium oxide-silicone resin composite body according to each of Examples and Comparative Examples was measured.

Here, a case where the hardness was equal to or higher and the tensile strength was decreased by only lower than 5% as compared to the standard sample was evaluated as "O". On the other hand, a case where the hardness was lower and the tensile strength was decreased by 5% or higher as compared to the standard sample was evaluated as "X". "O" represents a good product, and "X" represents a product having lower performance than the good product.

(8) Water Absorption

After stored in an environment of 40° C. and 90% RH for 48 hours, a mass change of each of the composite bodies was measured using an electronic balance. Here, a case where the mass change rate was lower than 1% was evaluated as "O", and a case where the mass change rate was 1% or higher was evaluated as "X". The lower the mass change rate, the better. Therefore, "O" represents a good product, and "X" represents a product having lower performance than the good product.

TABLE 1

| | Dispersed-Particle Diameter | Chlorine Content with respect to Surface-Modified Metal Oxide Particles | Ratio of Hydrosilyl Groups to Silanol Groups |
|---|---|---|---|
| Example 1 | 10 nm | 33 ppm | 30:70 |
| Example 2 | 10 nm | 33 ppm | 50:50 |
| Example 3 | 10 nm | 34 ppm | 10:90 |
| Comparative Example 1 | 11 nm | 1870 ppm | 98:2 |
| Comparative Example 2 | 11 nm | 1890 ppm | 4:96 |
| Comparative Example 3 | 10 nm | 34 ppm | 62:38 |

TABLE 2

| | Proton Ratio which was Calculated from Signals Derived from Hydrosilyl Groups and Hydrophobia Functional Groups (mol/mol) | Ratios of Hydrosilyl Groups to Hydrophobic Functional Groups (molar ratio) | Moisture Content (ppm) |
|---|---|---|---|
| Example 1 | 0.5/3 | 14:86 | 41 |
| Example 2 | 0.8/3 | 21:79 | 8 |
| Example 3 | 0.1/3 | 3:97 | 120 |
| Comparative Example 1 | 0.9/6 | 13:87 | — |
| Comparative Example 2 | 0.1/6 | 2:98 | — |
| Comparative Example 3 | 0.9/3 | 23:77 | 4 |

TABLE 3

| | Total Light Transmittance | Refractive Index | Hardness-Tensile Strength | Water absorption |
|---|---|---|---|---|
| Example 1 | ○ | ○ | ○ | ○ |
| Example 2 | ○ | ○ | ○ | ○ |
| Example 3 | ○ | ○ | ○ | ○ |
| Comparative Example 1 | ○ | ○ | ○ | ○ |
| Comparative Example 2 | ○ | ○ | x | x |
| Comparative Example 3 | ○ | ○ | ○ | ○ |

It was found from FIG. 1 that, in the surface-modified zirconium oxide toluene dispersion liquid according to Examples 1 to 3, an increase in the internal pressure of the airtight container was suppressed and the dispersion liquid was stable.

It was found from Table 3 that, in the surface-modified zirconium oxide-silicone resin composite body according to Examples 1 to 3, the transparency, the refractive index, and the mechanical characteristics were high and the water absorption was low.

On the other hand, in the zirconium oxide dispersion liquid according to Comparative Example 1, an increase in the internal pressure was large, and the production of hydrogen gas was found when measuring gas components in the airtight container by gas chromatography (GC method). The reason why a small amount of silanol groups were found in Comparative Example 1 is presumed to be that a small amount of silanol groups derived from methoxy groups of the surface modifier were present.

In the surface-modified zirconium oxide-silicone resin composite body according to Comparative Example 2, the total light transmittance and the refractive index were favorable, but the hardness-tensile strength and the water absorption were poor. Therefore, in a case where the surface-modified zirconium oxide-silicone resin composite body according to Comparative Example 2 is used as a sealing member, deterioration of a light emitting element or the like is expected.

In the surface-modified zirconium oxide-silicone resin composite bodies according to Comparative Examples 1 and 3, the hardness-tensile strength was equal to higher than that of the standard sample, but the hardness-tensile strength was slightly lower than that of the resin composite bodies according to Examples 1 to 3. Therefore, it was determined that the surface-modified zirconium oxide-silicone resin composite bodies according to Comparative Examples 1 and 3 were not appropriate for use as a sealing member.

INDUSTRIAL APPLICABILITY

In the surface-modified metal oxide particle-silicone resin composite body according to this invention, the surface-modified metal oxide particles according to this invention are dispersed in the silicone resin. As a result, optical characteristics such as refractive index and mechanical characteristics such as hardness can be exhibited while maintaining transparency. Therefore, the surface-modified metal oxide particle-silicone resin composite body according to this invention is useful as an optical member such as a sealing member or a microlens of a light emitting diode and is also applicable to an industrial field where optical characteristics, such as transparency and refractive index, and mechanical characteristics such as hardness are required at the same time. Therefore, the effects of this invention are significant.

The invention claimed is:

1. A surface-modified metal oxide particle dispersion liquid comprising:
    surface-modified metal oxide particles that are dispersed in a dispersion medium, the surface-modified metal oxide particles being obtained by modifying surfaces of metal oxide particles to have hydrosilyl groups, hydrophobic functional groups, and silanol groups,
    wherein a ratio of the hydrosilyl groups to the silanol groups is 5:95 or higher and 50:50 or lower.
2. The surface-modified metal oxide particle dispersion liquid according to claim 1,
    wherein an average dispersed-particle diameter of the metal oxide particles is 1 nm or more and 20 nm or less.
3. The surface-modified metal oxide particle dispersion liquid according to claim 1,
    wherein an amount of the insulating material with which the particles (B) are coated is 2% by mass to 30% by mass.
4. The surface-modified metal oxide particle dispersion liquid according to claim 1, further comprising:
    an acid component,
    wherein a content of the acid component with respect to the surface-modified metal oxide particles is 1 ppm or higher and 100 ppm or lower.
5. The surface-modified metal oxide particle dispersion liquid according to claim 1,
    wherein a moisture content measured using a Karl Fischer moisture titrator is 5 ppm or higher and 200 ppm or lower.
6. A method for producing a surface-modified metal oxide particle dispersion liquid comprising:

preparing surface-modified metal oxide particles by modifying surfaces of metal oxide particles using a hydrosilyl group-containing surface modifier which contains a hydrosilyl group and a hydrophobic functional group-containing surface modifier which contains a hydrophobic functional group, or using a combined surface modifier which contains both a hydrosilyl group and a hydrophobic functional group; and hydrolyzing the surface-modified metal oxide particles in a dispersion medium such that hydrogen atoms in some of the hydrosilyl groups are substituted with hydroxyl groups to convert the hydrosilyl groups into silanol groups, and a ratio of the hydrosilyl groups to the silanol groups is 5:95 or higher and 50:50 or lower.

7. The method for producing a surface-modified metal oxide particle dispersion liquid according to claim 6, wherein the hydrosilyl group-containing surface modifier is a silane compound containing both a hydrosilyl group and a hydrophobic functional group, the silane compound being represented by the following formula $H_rSiX_qY_{4-q-r}$, wherein X represents a saturated alkyl group represented by the following formula $C_nH_{2n+1}$ (where n represents an integer of 1 or more and 20 or less), a phenyl group, a cyclohexyl group, or a benzyl group, in a case where a plurality of X's are present, the X's may be the same as or different from each other;

Y represents chlorine, a hydroxyl group, an alkoxy group represented by the following formula $C_pH_{2p+1}O$ (where p represents an integer of 1 or more and 5 or less), an acetoxy group, a dimethylamino group, or a diethylamino group, in a case where a plurality of Y's are present, the Y's may be the same as or different from each other;

r represents an integer of 1 or 2;

q represents an integer of 1 or 2; and r+q represents an integer of 2 or 3.

8. The method for producing a surface-modified metal oxide particle dispersion liquid according to claim 6, wherein the hydrophobic functional group-containing surface modifier is a silane compound containing a hydrophobic functional group, the silane compound being represented by the following formula $SiX_mY_{4-m}$, wherein X represents a saturated alkyl group represented by the following formula $C_nH_{2n+1}$ (where n represents an integer of 1 or more and 20 or less), a phenyl group, a cyclohexyl group, or a benzyl group, in a case where a plurality of X's are present, the X's may be the same as or different from each other;

Y represents chlorine, a hydroxyl group, an alkoxy group represented by the following formula $C_pH_{2p+1}O$ (where p represents an integer of 1 or more and 5 or less), or an acetoxy group, in a case where a plurality of Y's are present, the Y's may be the same as or different from each other; and m represents an integer of 1 or more and 3 or less.

9. A surface-modified metal oxide particle-silicone resin composite composition comprising:

surface-modified metal oxide particles that are dispersed in an uncured silicone resin, the surface-modified metal oxide particles being obtained by modifying surfaces of metal oxide particles to have hydrosilyl groups, hydrophobic functional groups, and silanol groups, wherein a ratio of the hydrosilyl groups to the silanol groups is 5:95 or higher and 50:50 or lower.

10. A surface-modified metal oxide particle-silicone resin composite composition comprising:

the surface-modified metal oxide particle dispersion liquid according to claim 1; and a silicone resin.

11. A surface-modified metal oxide particle-silicone resin composite body which is obtained by curing the surface-modified metal oxide particle-silicone resin composite composition according to claim 9.

12. An optical member comprising:

the surface-modified metal oxide particle-silicone resin composite body according to claim 11.

13. A light emitting device which is obtained by sealing a light emitting element with the surface-modified metal oxide particle-silicone resin composite body according to claim 11.

* * * * *